US007782234B2

(12) United States Patent
Ahmad

(10) Patent No.: US 7,782,234 B2
(45) Date of Patent: Aug. 24, 2010

(54) SUCCESSIVE APPROXIMATION ANALOG-TO-DIGITAL CONVERTER WITH INBUILT REDUNDANCY

(75) Inventor: Fazil Ahmad, Bangalore (IN)

(73) Assignee: Analog Devices, Inc., Norwood, MA (US)

( * ) Notice: Subject to any disclaimer, the term of this patent is extended or adjusted under 35 U.S.C. 154(b) by 417 days.

(21) Appl. No.: 11/755,754

(22) Filed: May 31, 2007

(65) Prior Publication Data
US 2009/0109079 A1    Apr. 30, 2009

(51) Int. Cl.
H03M 1/06 (2006.01)
(52) U.S. Cl. .................. 341/118; 341/120; 341/155; 341/156; 341/163; 341/173
(58) Field of Classification Search ................ 341/118, 341/120, 155, 156, 163, 172
See application file for complete search history.

(56) References Cited

U.S. PATENT DOCUMENTS

| 4,641,129 | A  | * | 2/1987  | Doluca et al. | 341/156 |
| 5,138,319 | A  | * | 8/1992  | Tesch | 341/156 |
| 5,272,481 | A  |   | 12/1993 | Sauer | |
| 5,471,208 | A  | * | 11/1995 | Sauer | 341/120 |
| 5,644,308 | A  |   | 7/1997  | Kerth et al. | |
| 5,675,340 | A  | * | 10/1997 | Hester et al. | 341/156 |
| 6,456,220 | B1 | * | 9/2002  | Leung et al. | 341/155 |
| 6,459,400 | B1 | * | 10/2002 | Steinbach | 341/156 |
| 6,542,107 | B1 | * | 4/2003  | Galambos et al. | 341/172 |
| 6,559,789 | B1 | * | 5/2003  | Somayajula | 341/172 |
| 6,587,066 | B1 | * | 7/2003  | Somayajula | 341/172 |
| 6,667,707 | B2 | * | 12/2003 | Mueck et al. | 341/172 |
| 6,707,412 | B2 | * | 3/2004  | Suzuki | 341/156 |
| 6,894,672 | B2 | * | 5/2005  | Ruigt | 345/97 |
| 6,958,722 | B1 | * | 10/2005 | Janakiraman et al. | 341/161 |
| 7,038,609 | B1 | * | 5/2006  | Hurrell | 341/156 |
| 7,102,559 | B2 | * | 9/2006  | Van Tuijl | 341/156 |

(Continued)

OTHER PUBLICATIONS

International Search Report for WO/2008/146301, mailed Sep. 11, 2009.

(Continued)

Primary Examiner—Linh V Nguyen
(74) Attorney, Agent, or Firm—Kenyon & Kenyon LLP

(57) ABSTRACT

The method and system for converting an analog value into a digital equivalent using a plurality of conversion engines are disclosed. In one embodiment the plurality of conversion engines comprise N DACs associated with M comparators, wherein M is substantially greater than N, wherein M and N are integers, wherein each of the N CAP DACs has an associated P CAP DAC and an N CAP DAC, a method includes generating voltage differences between P CAP DACs and N CAP DACs such that they produce M threshold voltages. The plurality of conversion engines operate in a first phase of the conversion by inputting the produced M threshold voltages to associated inputs of M comparators so that more than one bit can be determined from a sampled signal during each successive approximation trial. The plurality of conversion engines operate in a second phase of the conversion by inputting the produced M threshold voltages into the associated inputs of the M comparators such that the plurality of conversion engines operate independently so that fewer bits are determined from the sampled signal during each successive approximation trial then were determined during the first phase. A result obtained from at least one of the plurality of conversion engines is then outputted.

41 Claims, 10 Drawing Sheets

U.S. PATENT DOCUMENTS

| | | | |
|---|---|---|---|
| 7,250,880 B2* | 7/2007 | Hurrell et al. | 341/111 |
| 7,408,490 B2* | 8/2008 | Melanson et al. | 341/120 |
| 7,515,083 B2* | 4/2009 | Chen et al. | 341/156 |
| 7,576,678 B2* | 8/2009 | Chatal et al. | 341/163 |
| 2008/0297381 A1* | 12/2008 | Kernahan et al. | 341/51 |
| 2009/0040089 A1* | 2/2009 | Dosho et al. | 341/161 |
| 2009/0184857 A1* | 7/2009 | Furuta et al. | 341/156 |

OTHER PUBLICATIONS

Khosrov Dabbagh-Sadeghipour, Khayrollah Hadid, Abdollah Khoei, "A New Architecture for Area and Power Efficient, High Conversion Rate Successive Approximation ADCs", Proc IEEE 2nd annual IEEE Northwest workshop on circuits and systems, pp. 253-256, 2004.

* cited by examiner

US 7,782,234 B2

SUCCESSIVE APPROXIMATION ANALOG-TO-DIGITAL CONVERTER WITH INBUILT REDUNDANCY

FIELD OF TECHNOLOGY

This disclosure relates generally to an analog-to-digital converter (ADC) and, in one example embodiment, to a method and circuit for an ADC that allows multiple bits to be examined in each bit trial are disclosed.

BACKGROUND

Users of ADCs generally wish to see high conversion accuracy and high conversion rates. These objectives are generally opposed, and become more difficult to achieve when a user also seeks for such devices to be relatively inexpensive.

Where reduced cost, reduced power and/or greater accuracy is required, it is known to use successive approximation ADCs. A successive approximation ADC performs digital approximation of the input analog voltages that are determined on the basis of a binary search. A digital value stored in an n-bit successive approximation register (SAR) is input to a digital-to-analog converter, and a decision is made as to whether the value in the SAR represents an analog voltage that is higher or lower than the input analog value. Thus, a successive approximation converter seeking to produce an 8 bit output has to perform 8 bit trials. Therefore, due to the serial way by which the result is derived by the SAR ADCs, they are inherently slow.

One current SAR ADC technique discloses an ADC having three converters which co-operate such that each trial can determine two bits within the digital word. Whilst the performance of this device appears to be good, i.e., it reaches a conversion result much more rapidly, it suffers from several significant shortcomings. One shortcoming being, in the real world, components and systems, are noisy, whether this noise comes via the power supply lines or from self generated thermal noise. Another shortcoming is that collaborative bit trials are only possible as long as the miss-match errors between collaborative conversion engines are smaller than the resolution of the converter. This may in practice limit to ADCs to about 10 bits. One such error can come from Vt shift of comparator's MOSFETs which gives difference in non linearity (DNL) patterns. Another error can be due to settling of DAC voltage which gives DNL patterns. Yet another error can be due to settling of reference voltage which can give rise to DNL flaring and can degrade signal-to-noise ratio (SNR). Yet another error can be due to noise on DAC, reference and comparator which can increase DNL band and degrade SNR. Generally, to correct these errors redundant bit trials are used, which can take one bit trial time for each redundant bit trial. This can result in reduced speed. Further, the above SAR ADC technique does not automatically redress the errors. Furthermore, there are no provisions in this successive approximation algorithm for error corrections resulting from any of the above described errors.

Another current SAR ADC technique discloses an ADC which typically uses at least three analog-to-digital conversion engines that works in a collaborative manner during a first part of a conversion where the resulting settling errors and noise are corrected in subsequent trials. The analog-to-digital conversion engines then operate independently during a second cycle such that any settling errors and/or noise are corrected in the second cycle. However, when using more than three ADC conversion engines, this technique can require a large die area. Further, when using three ADC conversion engines, all of the above mentioned errors and noise are present in addition to requiring a large die area.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

The method and device for converting an analog value into a digital equivalent using an analog to digital converter are disclosed. In the following description, for purposes of explanation, numerous specific details are set forth in order to provide a thorough understanding of the various embodiments. It will be evident, however, to one skilled in the art that the various embodiments may be practiced without these specific details.

The terms ADC and SAR ADC are used interchangeably throughout the document. Furthermore, the terms conversion engine and analog to digital conversion engine are used interchangeably throughout the document.

Figure 1:
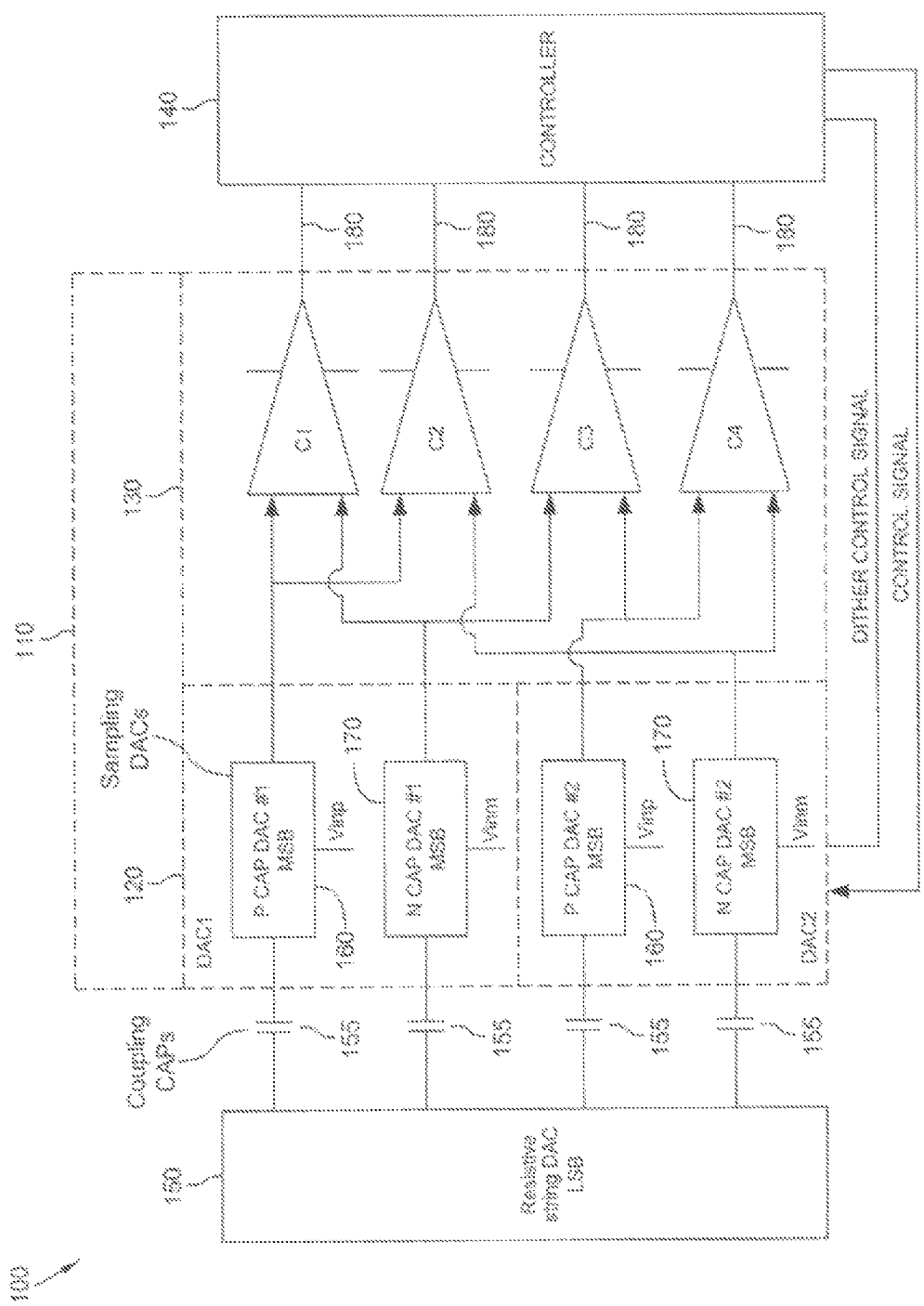
FIG. 1 is a schematic diagram of a differential SAR ADC according to one embodiment of the present subject matter.

FIG. 1 schematically illustrates an example successive approximation analog to digital converter (SAR ADC) 100. As shown in FIG. 1, the SAR ADC 100 includes a plurality of conversion engines 110. In some embodiments, the plurality of conversion engines 110 are switched capacitor analog to digital converters. The plurality of conversion engines 110 includes N DACs 120 and M comparators 130. In these embodiments, M is substantially greater than N and M and N are integers.

Each of the N DACs 120 has an associated P CAP DAC 160 and N CAP DAC 170. FIG. 1 shows a simplified architecture of the plurality of conversion engines 110 including 2 DACs DAC1 and DAC2 and 4 comparators C1, C2, C3, and C4 to demonstrate the working of the SAR ADC 100 of the present subject matter. In this embodiment, a common resistive DAC is used on the LSB side. In some embodiments, NDACs are associated with less than or equal to $N^2$ comparators. In these embodiments, $N^2$ comparators are equal to number of conversion engines in the plurality of conversion engines 110. In some embodiments, the plurality of conversion engines 110 includes at least 2 conversion engines.

Further as shown in FIG. 1, each of the plurality of conversion engines 110 are in communication with a controller 140 which receives output from each of the plurality of comparators 130 via associated control busses 180 for controlling N DACs. Furthermore as shown in FIG. 1, each of the P CAP DACs and N CAP DACs are connected to associated analog voltage inputs Vinp and Vinm, respectively. Also as shown in FIG. 1, the plurality of conversion engines 110 are coupled to a resistive string DAC 150 via coupling CAPs 155. In some embodiments, the plurality of conversion engines 110 are coupled to a capacitive DAC via the coupling CAPs 155. The coupling CAPs can be any capacitors.

Figure 2:
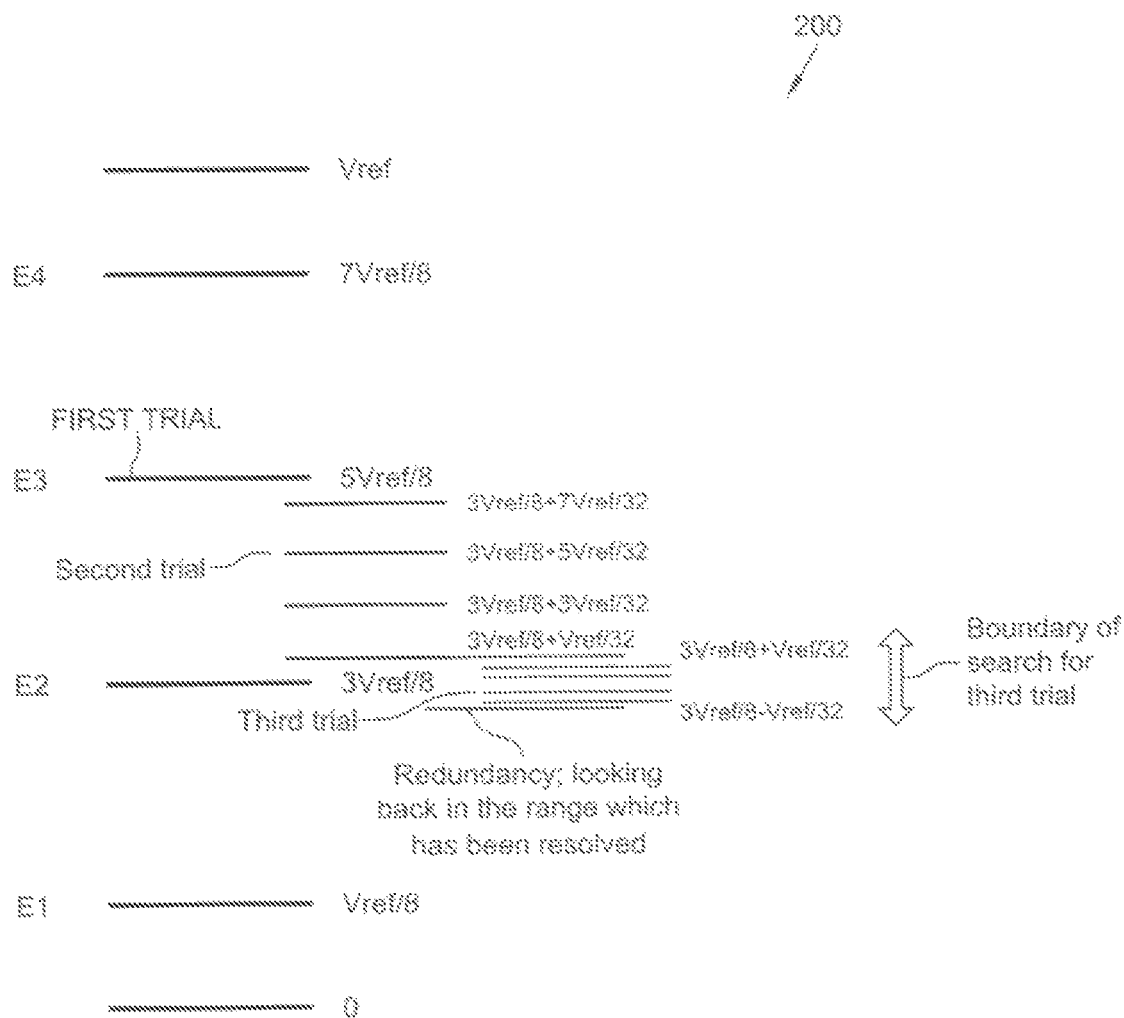
FIG. 2 schematically illustrates the conversion process for a SAR ADC according to one embodiment of the present subject matter.

The operation of the SAR ADC 100 will now be described; initially it is useful to consider the embodiment shown in FIG. 1 in which only 2 DACs and 4 comparators are provided. FIG. 2 schematically illustrates the conversion process 200 for converting a 7 bit word where the converted value of the word corresponds to "0101111" for an inbuilt redundancy case. As noted before the SAR ADC 100 is capable of much greater levels of accuracy, but this example is deliberately kept simple for clarity. During the first trial the first conversion engine including a first DAC (i.e., P CAP DAC #1 and NCAP DAC #1) along with the comparator C1 is set such that the threshold voltage of the first conversion engine is equal to Vref/8. This condition is designated as line E1 in FIG. 2. Second conversion engine including a second DAC (i.e., P CAP DAC #1 and N CAP DAC #2) along with the comparator C2 is set such that the threshold voltage will be equal to 3Vref/8. This condition is designated as line E2 in FIG. 2. Third conversion engine including a third DAC (i.e., P CAP DAC #2 and N CAP DAC #1) along with the comparator C3 is set such that the threshold voltage is at 5Vref/8. This condition is designated by line E3. Finally, fourth conversion engine, including a fourth DAC formed using P CAP DAC #2 and N CAP DAC #2, along with the comparator C4 is set such that the threshold voltage is at 7Vref/8. This condition is represented by line E4.

At the end of the first trial, the outputs of the comparators are checked and the controller 140 notes that the analog input value is less than the threshold values E2, E3 and E4. As a result, the controller 140 knows that the analog input signal lies between the threshold voltages Vref/8 and 3 Vref/8 and the trial then progresses to the second trial. The next trial, when using four conversion engines, conducts further investigations within the range of E2 and E1. It can be seen that the above conversion process repeats itself until a desired resolution is obtained.

In case during the first trial an error is encountered and a decision that the analog input signal lies between the threshold voltages 3 Vref/8 and 5 Vref/8 is taken, then the controller 140 conducts further investigation in the range of 3 Vref/8 and 5 Vref/8 during a second bit trial. In such a scenario, as shown in FIG. 2 the threshold voltages in the second bit trial will be set at 3 Vref/8+Vref/32, 3 Vref/8+3 Vref/32, 3 Vref/8+5Vref/32, and 3 Vref/8+7Vref/32. The second bit trial results in the analog input signal being less than 3Vref/8+Vref/32. In the third bit trial the range of search for the third conversion will be conducted between 3Vref/8−Vref/32 to 3Vref/8+Vref/32. It can be seen that the range of search conducted in the first bit trial has an overlap with the range of search in third trial and any error occurred during the first bit trial will be corrected in the third or subsequent bit trials; in sequel provides the inbuilt redundancy.

After several "shared" or co-operative bit trials are performed, the SAR ADC 100 switches its mode of operation such that plurality of converters, C1, C2, C3 and C4 works independently to achieve the end results. In these embodiments, the end results are then combined by the controller 140. The combination could be done by averaging the output results, i.e., output words, or by performing any other processing on the output results.

The chip manufacturer generally determines how many comparisons should be made in the first cooperative bit trial mode before the SAR ADC 100 switches modes to the second mode in which each of the plurality of conversion engines 110 works independently. However, this could also be set in a user controllable register or the like.

It can be seen that the fourth conversion engine including a fourth DAC (i.e., P CAP DAC #2 and N CAP DAC #2) along with the comparator C4 can be used for an (X+1)th bit trial. Also, it can be seen that the trial space examined by the SAR ADC 100 when using the fourth conversion engine is greater than one-quarter of the trial space of the Xth bit trial. In these embodiments, X is an integer. The trial range of a current bit trial is offset and the offset can correspond to half the size of a least significant bit (LSB) being tested. In some embodiments, at least one of the plurality of conversion engines 110 is responsive to an offset compensation circuit for introducing an offset to the plurality of conversion engines 110.

It can be seen that, for the without redundancy case, the conversion process in the first bit trial can take place at threshold voltages of Vref/4, 2Vref/4 and 3Vref/4. Based on comparator outputs the range of search for the subsequent trials changes. The threshold voltages for the range of search in the subsequent trials are obtained from the threshold voltages associated with the prior bit trial. In case the first bit trial analog conversion results lie between Vref/4 and 0, then the second bit trial can take place at threshold voltages of Vref/4+Vref/16, Vref/4+2Vref/16, and Vref/4+3Vref/16. It can be seen that the above conversion process repeats itself for subsequent bit trials until a desired resolution is obtained.

In these embodiments, the controller 140 examines the output of each of the plurality of conversion engines 110 while they are operating independently and is adapted to modify the offset compensation provided by a compensation circuit associated with a conversion engine to bring the output of the plurality of conversion engines 110 into conformity. In these embodiments, the value of the offset applied to the plurality of conversion engines 110 is maintained at a preset value.

In some embodiments, the controller 140 forms a sum of the offsets applied to the plurality of conversion engines 110 and uses it to apply a correction to an output from the SAR ADC 100. In some embodiments, the analog to digital conversion is temporarily halted during the first phase, and an error correction step is performed in which all of the conversion engines are set to the same threshold voltages and the capacitor arrays are temporarily connected together such that they have the same voltage on each array for the same digital word.

In some embodiments, the SAR ADC 100 includes a dither generator for introducing a known perturbation (i.e., a dither control signal) that is independently to the plurality of conversion engines 110 during the second phase of the analog to digital conversion. In these embodiments, the second phase of the analog to digital conversion is a LSB trial phase, in which the plurality of conversion engines 110 does not work in a collaborative manner.

In some embodiments, each conversion engine includes a sampling capacitor or a capacitor array on to which a value to be converted is sampled. In these embodiments, a controller array is provided for controlling the operation of the plurality of conversion engines 110. Also in these embodiments, the (X+1)th bit trial following an Xth bit trial has a trial space greater than one quarter of the trial space of the Xth bit trial.

Having considered operation of the present invention with 2 DACs and 4 comparators, it is now possible to see how the use of 3 DACs and 9 comparators produces 3 bits per trial with 0.5 bit redundancy and the use of 4 DACs and 16 comparators produce 4 bits/clock with 0.5 bit redundancy and so on can be accommodated. The benefits derived using this approach can also be envisioned.

Figure 8:
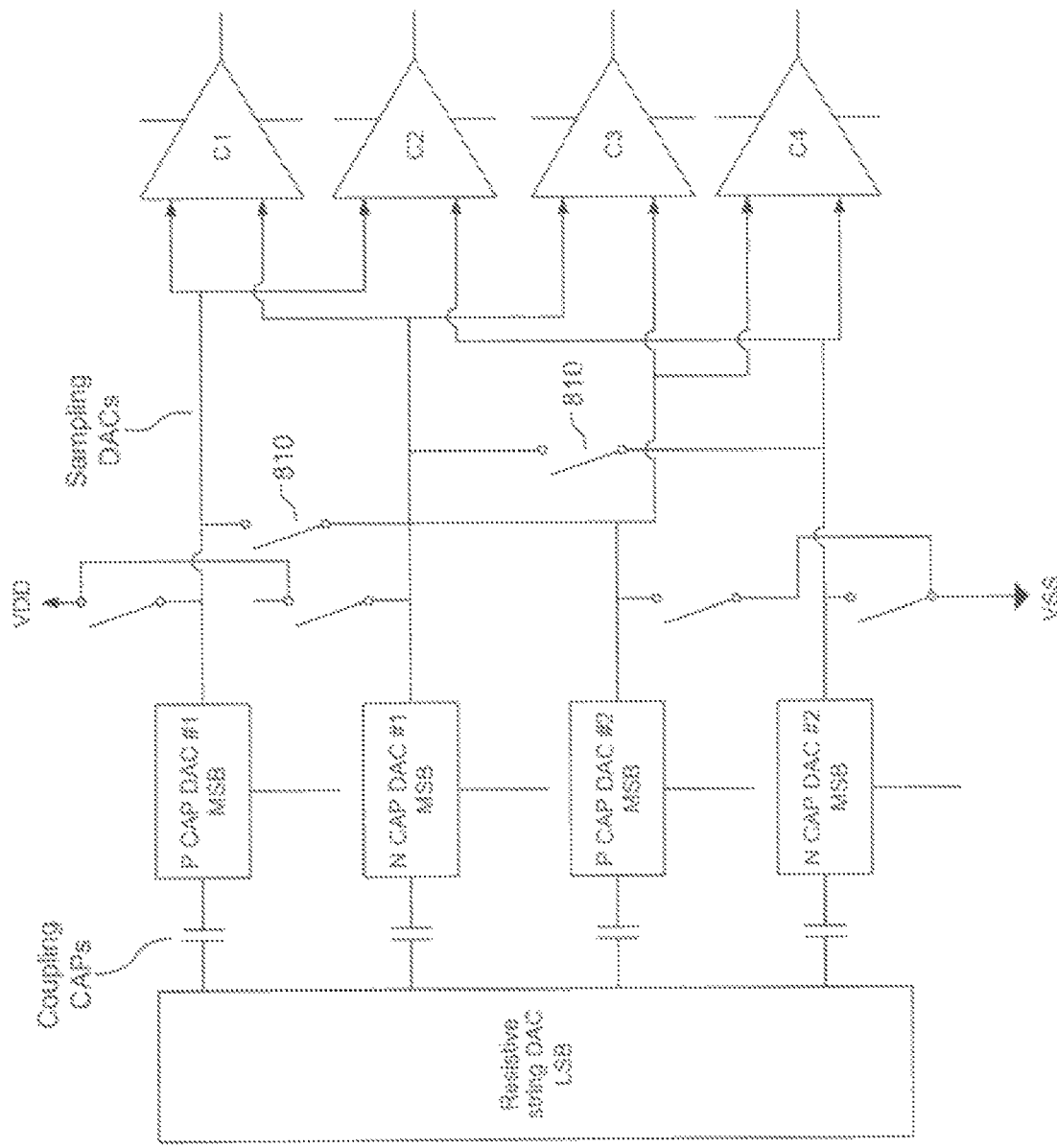
FIG. 8 is a schematic diagram of SAR ADC with common mode generation according to an embodiment of the present subject matter.

In some embodiments, a top plate of half of the PCAP DACs is connected to VDD and top plate of half of the P CAP DACs is connected to GND during sampling of the signal. A common mode voltage is then generated by shorting the top plates after sampling the signal as shown in FIG. 8. In operation, once the common mode voltage has settled, switches connecting 2 DACs are in open state. Similarly, for embodiments including N CAP DACs, once the common mode voltage has settled, switches connecting 2 DACs will also be in open state.

Figure 3:
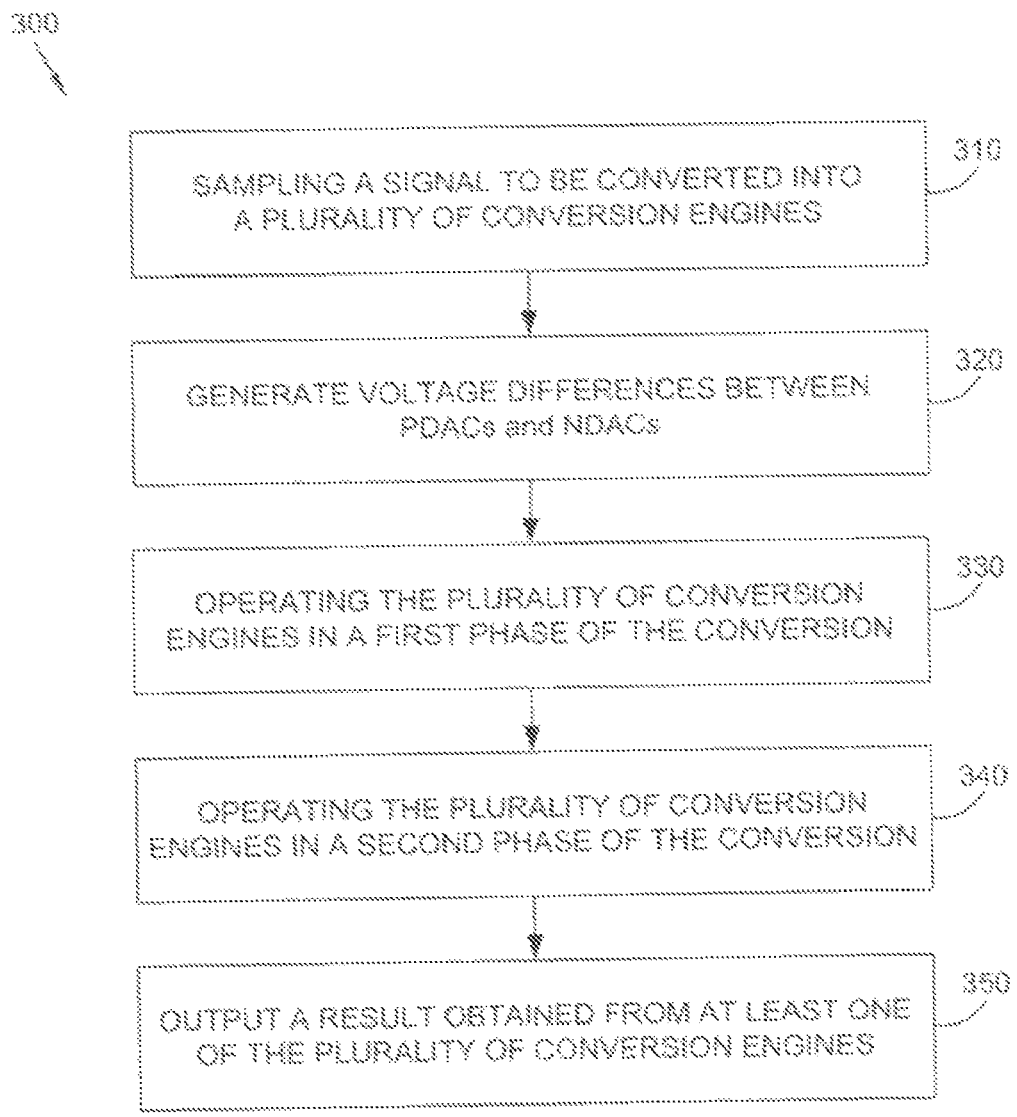
FIG. 3 is a flowchart illustrating a method for controlling the operation of a SAR ADC, such as those shown in FIGS. 1-2, according to one embodiment.

FIG. 3 is a flowchart 300 illustrating a method of converting an analog value into a digital equivalent using a plurality of conversion engines according to an embodiment of the present subject matter. The method 300 begins with step 310 by sampling a signal to be converted into the plurality of conversion engines. In some embodiments, the signal to be converted is sampled into each P CAP DAC.

At step 320, voltage differences between P CAD DACs and N CAP DACs are generated such that they produce M threshold voltages. Following illustrate the generation of threshold voltages when the SAR ADC has 2 N CAP DACs and 2 P CAP DACs and how each P CAP DAC is compared with both N CAP DACs, i.e., N CAP DAC 1 and N CAP DAC 2;

PDAC1–NDAC1 - - - generates threshold voltage corresponding to Vref/8 (i.e., first threshold for first bit trial)

PDAC1–NDAC2 - - - generates threshold voltage corresponding to 3Vref/8 (i.e., second threshold for first bit trial)

PDAC2–NDAC1 - - - generates threshold voltage corresponding to 5Vref/8 (i.e., third threshold for first bit trial)

PDAC2–NDAC2 - - - generates threshold voltage corresponding to 7Vref/8 (i.e., fourth threshold for first bit trial)

For the differential SAR ADC case where the voltage supplies are 0 and Vref, then 0V correspond to 0 digital code And Vref correspond to full digital code And Vref/2 correspond to mid digital code Differential signal Vi+=V common mode+Vd/2

Differential signal Vi−=V common mode−Vd/2

In the above the difference between the sampled voltages is Vd (i.e., twice of vd/2)

For example, if PDAC #1 bottom plate voltage selection is represented by A1, NDAC #1 bottom plate by B1, PDAC #2 bottom plate by A2, and NDAC #2 bottom plate by B2, the threshold voltages are generated as shown in the below equations:

$$Vd = Vinp - Vinm$$

$$Vref/2 + Vd/2 <=> Vref/8 => Vd \Leftrightarrow 2(Vref/8 - Vref/2) = A1 - B1$$

$$Vref/2 + Vd/2 <=> 3Vref/8 => Vd \Leftrightarrow 2(3Vref/8 - Vref/2) = A1 - B2$$

$$Vref/2 + Vd/2 <=> 5Vref/8 => Vd \Leftrightarrow 2(5Vref/8 - Vref/2) = A2 - B1$$

$$Vref/2 + Vd/2 <=> 7Vref/8 => Vd \Leftrightarrow 2(7Vref/8 - Vref/2) = A2 - B2$$

The above four equations have four unknowns and hence they can be solved to obtain the respective threshold voltages.

When the common mode voltage of the SAR ADC is 0, the threshold voltages are generated as shown using the below equations:

$$Vd = Vinp - Vinm$$

$$Vd/2 <=> Vref/8 => Vd \Leftrightarrow 2(Vref/8) = A1 - B1$$

$$Vd/2 <=> 3Vref/8 => Vd \Leftrightarrow 2(3Vref/8) = A1 - B2$$

$$Vd/2 <=> 5Vref/8 => Vd \Leftrightarrow 2(5Vref/8) = A2 - B1$$

$$Vd/2 <=> 7Vref/8 => Vd \Leftrightarrow 2(7Vref/8) = A2 - B2$$

Again, it can be seen that there are four equations above and there are four unknowns that can be solved to obtain the threshold voltages.

At step 330, the plurality of conversion engines operate in a first phase of the conversion by inputting the produced M threshold voltages to associated inputs of M comparators so that more than one bit can be determined from the sampled signal during each successive approximation trial. In some embodiments, the plurality of conversion engines operate in a first phase of the conversion by inputting the produced M threshold voltages to associated inputs of the M comparators so that 2 bits are determined per trial. In the single ended SAR ADC case, the plurality of conversion engines operate in a first phase of the conversion by inputting the M threshold voltages to associated comparators so that they cooperate to determine more than one bit from the sampled signal during at least one successive approximation trial.

At step 340, the plurality of conversion engines operate in a second phase of the conversion by inputting the produced M threshold voltages into the associated inputs of the M comparators such that the plurality of conversion engines operate independently so that fewer bits are determined from the sampled signal during each successive approximation trial than what was determined during the first phase. In these embodiments, the bits are integers and/or fractions. In some embodiments, the plurality of conversion engines operate in a second phase of the conversion by inputting the produced M threshold voltages into the associated inputs of the M comparators such that the plurality of conversion engines operate independently so that one bit is determined per trial. In some embodiments, sampling capacitor arrays in the plurality of conversion engines are connected in parallel in the second phase of operation so as to form a combined conversion engine. The bit trials are then continued in parallel after connecting the capacitor arrays of the plurality of conversion engines.

At step 350, a result obtained from at least one of the plurality of conversion engines is outputted. In some embodiments, result from each conversion engine is obtained and processed to give a single output value. In another embodiment, results obtained from each of the plurality of conversion engines is averaged and outputted.

Figure 4:
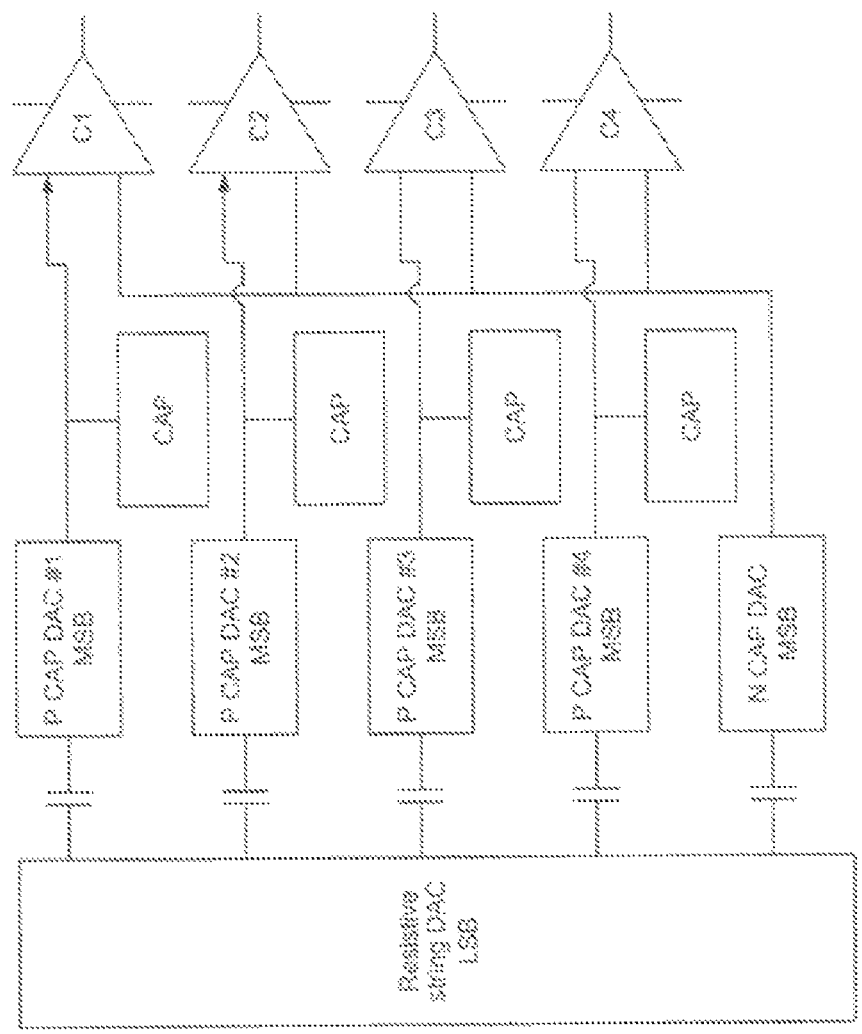
FIG. 4 is a schematic diagram of a single ended SAR ADC according to one embodiment of the present subject matter.

FIG. 4 shows an exemplary single ended SAR ADC 400. As shown in FIG. 4, the single ended SAR ADC has 4 PCAP DACs and one NCAPDAC. In these embodiments, and difference of 4 CAP DACs with one NCAP DAC gives four threshold voltages which are inputted into 4 associated comparators C1, C2, C3 and C4. For simplicity, FIG. 4 shows the single ended SAR ADC 400 architecture including 4 PCAP DACs and one NCAPDAC, however, it can be seen that the single ended SAR ADC 400 can have X PCAP DACs, Y NCAP DACs with M associated comparators. The single ended SAR ADC shown in FIG. 4 includes a capacitor CAP to have equal charge sharing which will facilitate in equal signal attenuation.

Figure 5:
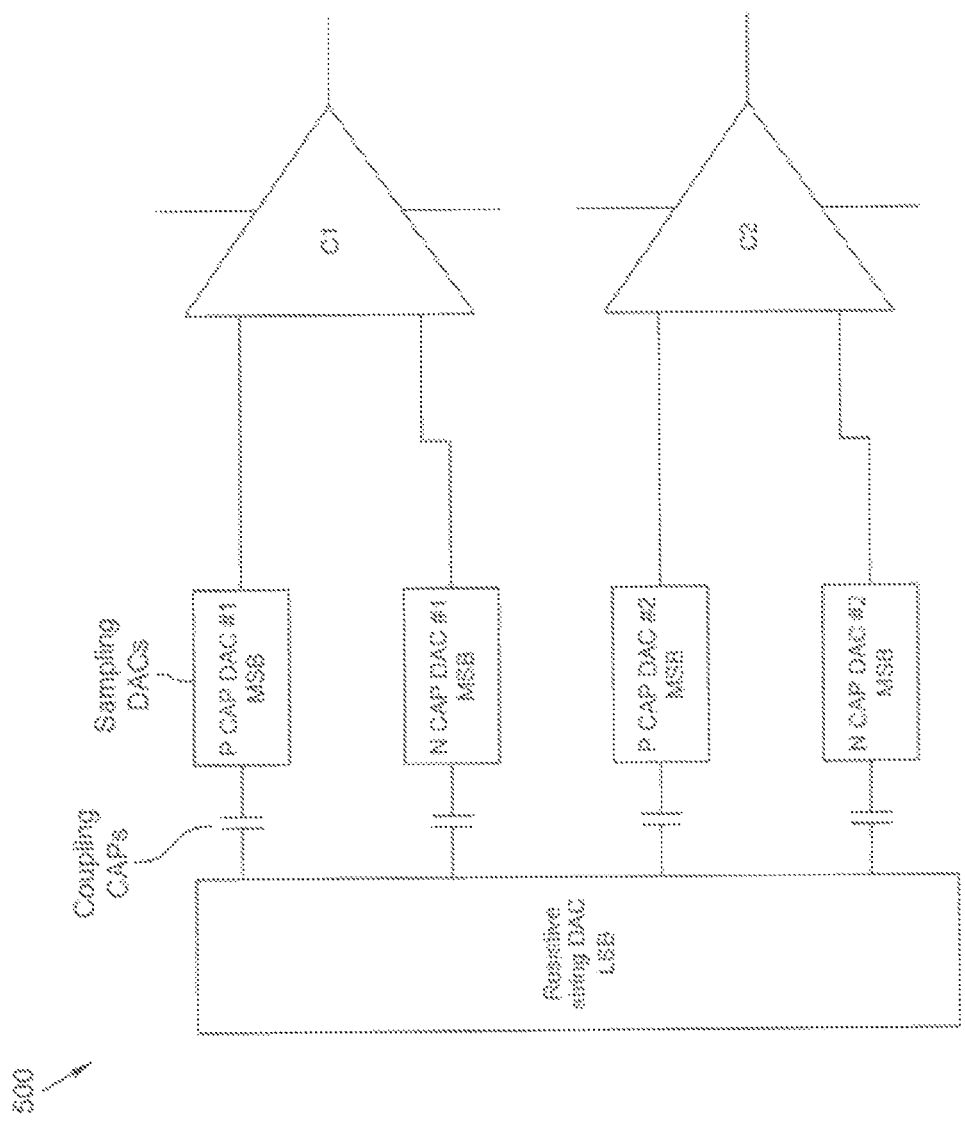
FIG. 5 is a schematic diagram of a differential SAR ADC for 1.5 bit per trial with inbuilt redundancy according to one embodiment of the present subject matter.
Figure 6:
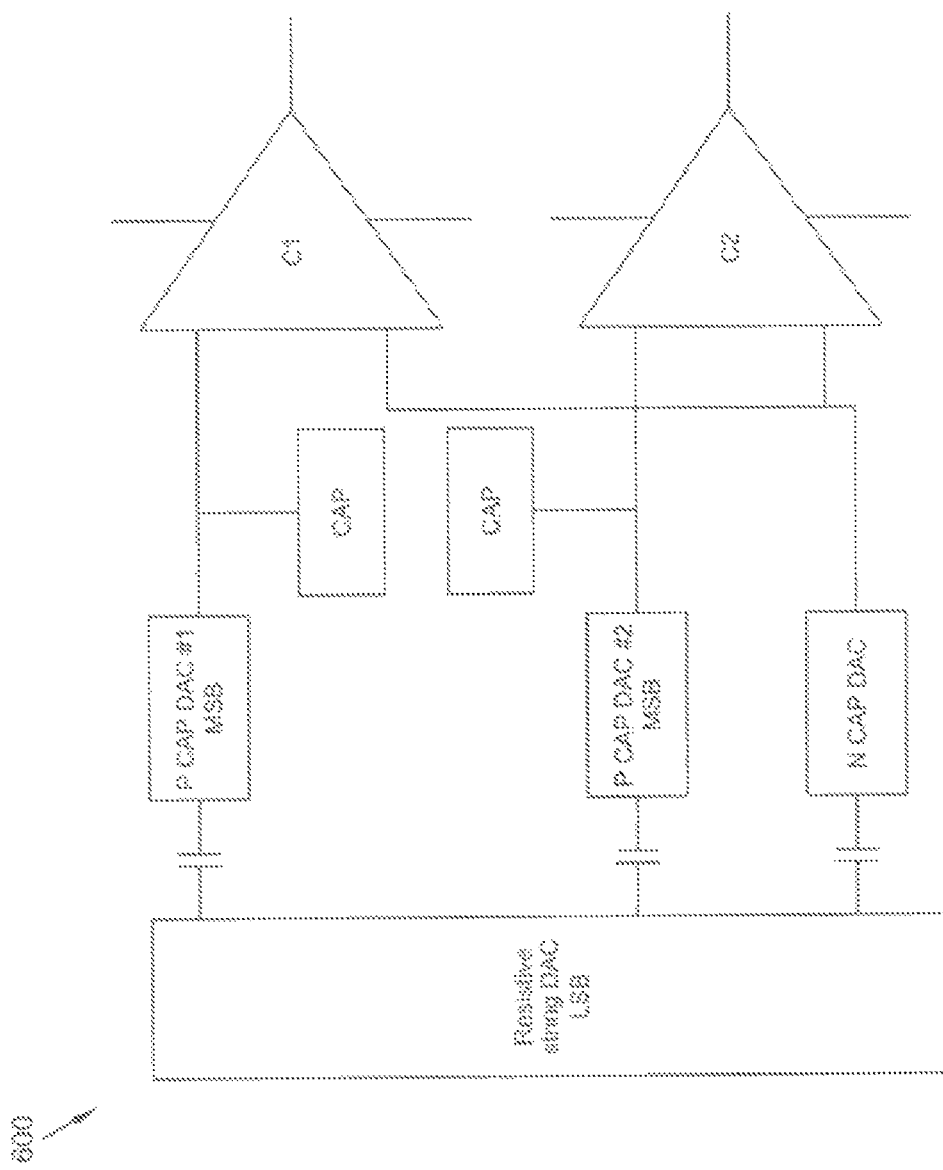
FIG. 6 is a schematic diagram of a single ended SAR ADC for 1.5 bit per trial with inbuilt redundancy according to one embodiment of the present subject matter.
Figure 7:
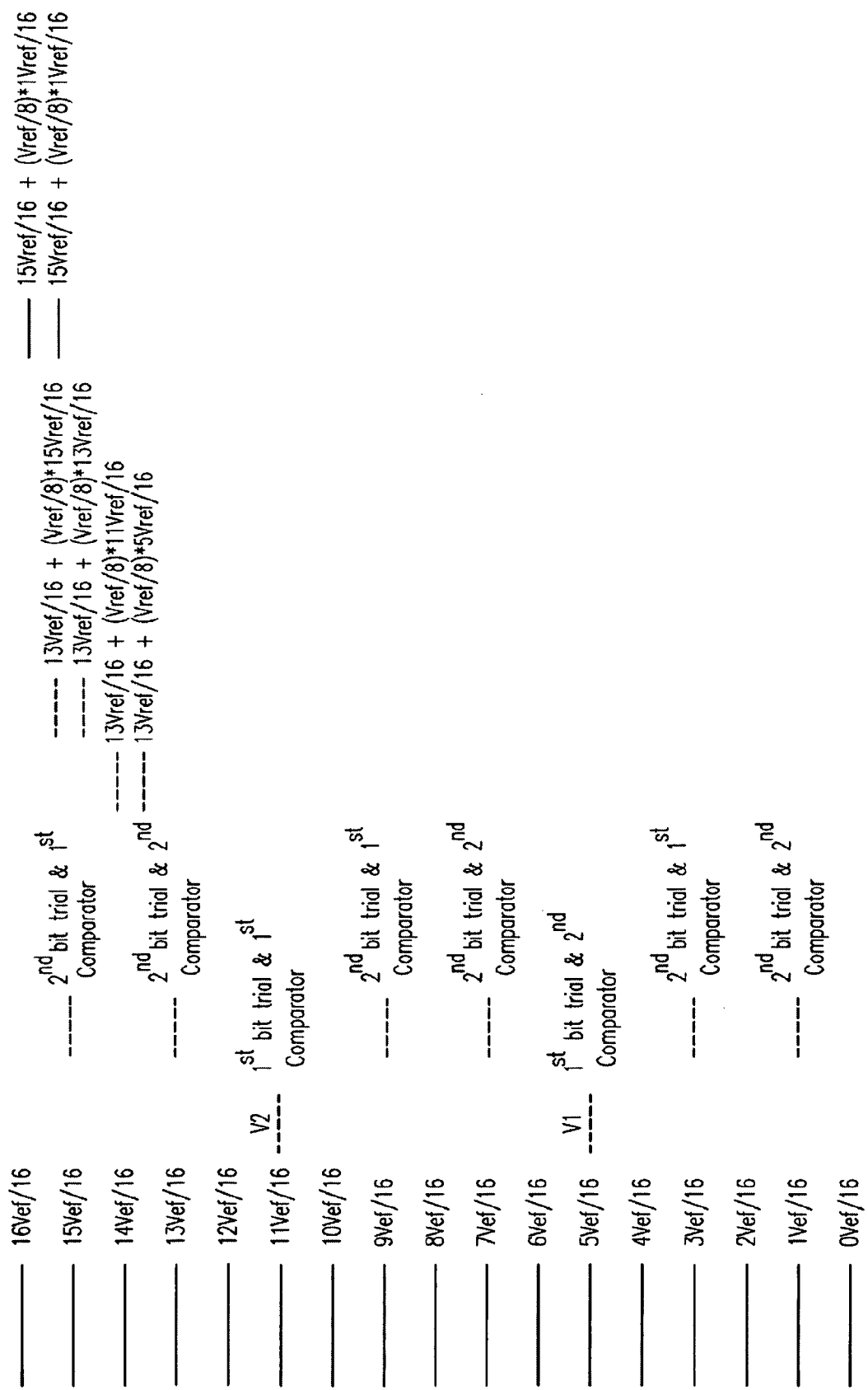
FIG. 7 schematically illustrates the conversion process for single ended and differential SAR ADCs with 1.5 bit per trial with inbuilt redundancy according to an embodiment of the present subject matter.

FIG. 7 schematically illustrates the conversion process using 1.5 bits per trial for converting a 6 bit word where the converted value of the word corresponds to "111100", for inbuilt redundancy case, using the SAR ADCs 500 and 600, respectively, shown in FIGS. 5 and 6. As noted before the SAR ADCs 500 and 600 are capable of much greater levels of accuracy, but this example is deliberately kept simple for clarity.

For simplicity, the following explanation of the conversion process will be explained with reference to FIG. 5. During the first trial the first conversion engine including a first DAC (i.e., P CAP DAC #1 and NCAP DAC #1) along with the comparator C1 is set such that the threshold voltage of the first conversion engine is equal to 5Vref/16 and this condition is shown by using the line V1. Second conversion engine including a second DAC (i.e., P CAP DAC #2 and N CAP DAC #2) along with the comparator C2 is set such that the threshold voltage will be equal to 11Vref/16 and this condition is shown by using the line V2.

At the end of the first trial, the outputs of the comparators C1 and C2 are checked and the controller notes that the analog input value lie's between the threshold values 11Vref/16 V2 and Vref and the trial then progresses to the second trial. Based on the first bit trial output the next two threshold voltages can be 13 Vref/16 and 15 Vref/16. Based on previous bit trails the range of search can be significantly reduced. The above process repeats itself until a desired resolution is obtained. It can be seen that at the end of first and second bit trials the above process yields 3 bits and having inbuilt redundancy.

In case an error is encountered during the second trial and a decision that the analog input signal is less than 15 Vref/16 is taken then the threshold voltages in the subsequent trial can be 13 Vref/16+Vref/8*5Vref/16 and 13Vref/16+Vref/8*11Vref/16. If the trial results in analog input signal being greater than 13Vref/16+Vref/8*11Vref/16. The subsequent trial threshold voltages can be 13Vref/16+Vref/8*13Vref/16 and 13Vref/16+Vref/8*15Vref/16. If the subsequent trial results that the analog input signal is greater than 13 Vref/16+Vref/8*15Vref/16, then the further subsequent trial can have threshold voltages in the range of 15 Vref/16−Vref/8*Vref/16 and 15Vref/16+Vref/8*Vref/16. The range of further subsequent trial overlaps with the range of second bit trial which gives the inbuilt redundancy.

It can be seen that by using the above described inbuilt redundancy technique any resulting errors can be corrected in the subsequent bit trials. FIG. 7 shows an exemplary threshold voltage selection and one can envision any number of other voltage selections that are possible using this technique. It can be seen that the same can be achieved for without redundancy case as well.

In some embodiments, a top plate of half of the PCAP DACs is connected to VDD and top plate of half of the P CAP DACs is connected to GND during sampling of the signal. A common mode voltage is then generated by shorting the top plates after sampling the signal as shown in FIG. 8. In operation, once the common mode voltage has settled, switches connecting 2 DACs 810 as shown in FIG. 8 will be open. The above-described process works similarly for embodiments including N CAP DACs also.

Figure 9:
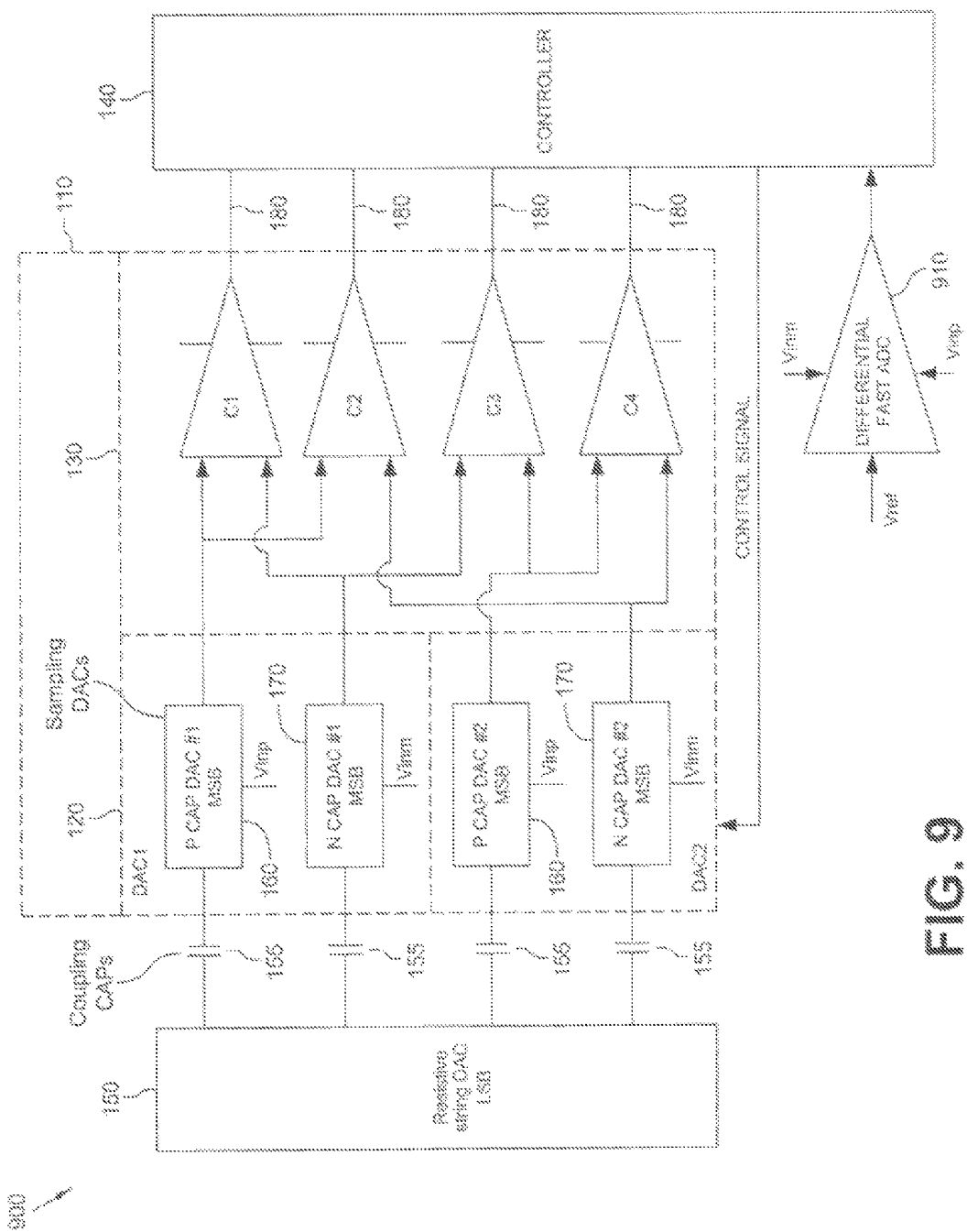
FIG. 9 is a schematic diagram of SAR ADC including flash ADC according to one embodiment of the present subject matter.

FIG. 9 schematically illustrates an example differential flash ADC 900 that is used in facilitating SAR ADC. As shown in FIG. 9, the flash facilitated SAR ADC 900 is similar to the SAR ADC 100 shown in FIG. 1, except it further includes a differential fast ADC 910 that is coupled to the controller 140. Further as shown in FIG. 9, the differential fast ADC 910 is coupled to receive a reference voltage Vref and analog voltage inputs Vinp and Vinm.

In operation, the differential fast ADC 910 performs a coarse conversion of the input signal to be converted and outputs the coarse conversion result. During a first phase of analog to digital conversion process the plurality of conversion engines 110 collaborates such that a plurality of bits may be determined during a single trial step using the coarse conversion result and the input signal.

During a second phase of the analog to digital conversion process the plurality of conversion engines work independently so that fewer bits may be determined using the coarse conversion result, first phase results and the input signal. The controller 140 receives outputs of at least one of the plurality of conversion engines and processes the received outputs to provide an output result.

Figure 10:
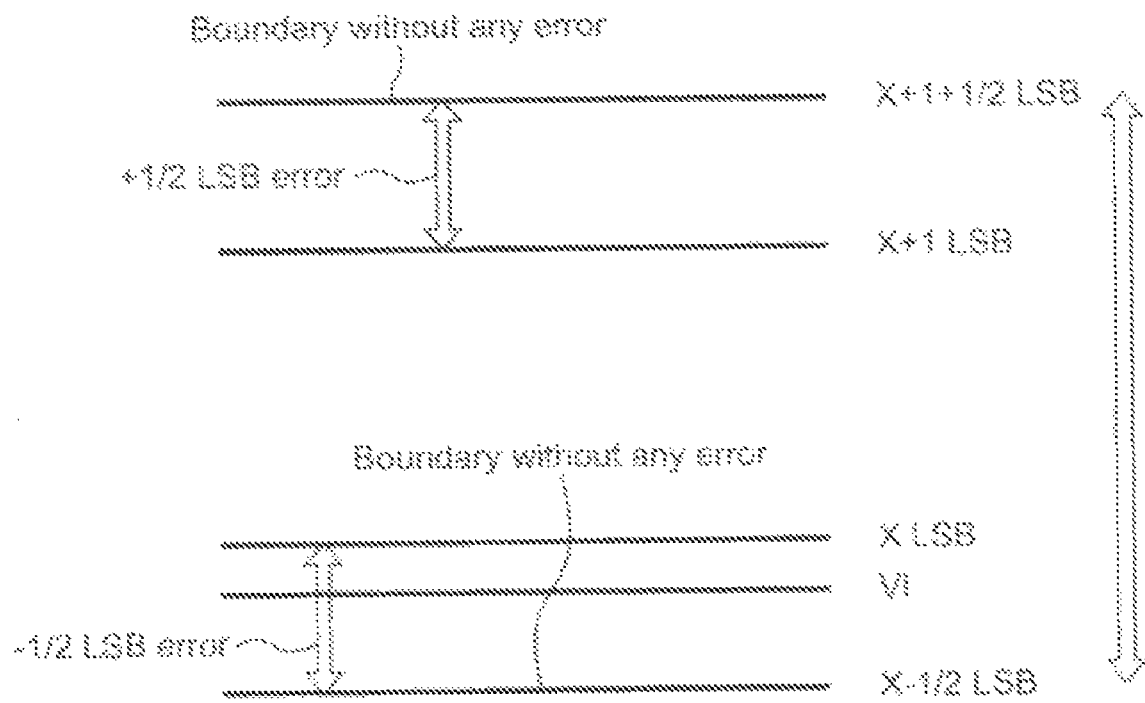
FIG. 10 schematically illustrates the error correction process of fast ADC according to an embodiment of the present subject matter.

FIG. 10 schematically illustrates an exemplary error correction process of single ended or differential fast ADC. The differential fast ADC 910 shown in FIG. 9 includes two single ended fast ADCs. Generally, the error made by the flash ADC 900 is half LSB of its resolution. As shown in FIG. 10, when the input Vi lies between X LSBB and X−½LSB and due to the error of flash ADC 900 the flash output resulted between X LSB to X+1 LSB. Because the maximum error a flash ADC 900 can have is half LSB, and from the output of flash ADC 900 we can infer that the analog input signal lies in between X−½LSB to X+3⁄2LSB. If the error of flash ADC is more than half LSB this equation changes accordingly to accommodate that error. Similarly, for other differential input, it can be know that analog input signal lies between Y−½LSB to Y+3⁄2LSB.

The following example illustrates a resolution of flash ADC 900 of 4 bit:

Suppose $V_{in+}$ lies in this boundary $((X-½)V_{ref}/16 < V_{cm} + V_d/2 < (X+3⁄2)V_{ref}/16)$ & $V_{in+}$ lies in $((Y-½)V_{ref}/16 < V_{cm} - V_d/2 < (Y+3⁄2)V_{ref}/16)$.

$(Y-½)V_{ref}/16 < V_{cm} - V_d/2 < (Y+3⁄2)V_{ref}/16 => -(Y+3⁄2)V_{ref}/16 < -V_{cm} + V_d/2 < -(Y-½)V_{ref}/16$ This results in following two conditions:

$$(X-½)V_{ref}/16 < V_{cm} + V_d/2 < (X+3⁄2)V_{ref}/16 \quad (I)$$

$$(Y+3⁄2)V_{ref}/16 < -V_{cm} + V_d/2 < -(Y-½)V_{ref}/16 \quad (II)$$

The following equation can be obtained by adding the above two equations:

$$(X-Y)V_{ref}/32 - V_{ref}/16 < V_d/2 < (X-Y)V_{ref}/32 + V_{ref}/16$$
(boundary of $2V_{ref}/16$ is same as 3 bit information).

It can be inferred that $V_d/2$ lies in the boundary of $2V_{ref}/16$ from $(X-Y)V_{ref}/32-V_{ref}/16$ to $(X-Y) V_{ref}/32+V_{ref}/16$, and Vref/2+Vd/2 lies in the boundary $(X-Y)V_{ref}/32-V_{ref}/16+$ Vref/2 to $(X-Y) V_{ref}/32+V_{ref}/16+$vref/2.

The above information is used in the first conversion of SAR ADC. This boundary defines the range of search for the differential SAR ADC. This can help in reducing the input common mode range of comparator.

It can be seen that the single ended flash ADC case is similar in operation as the above described differential flash ADC except for the removal of input common mode voltage. For single ended case the below information comes from the flash ADC $V_{in+}$ lies in this boundary $((X-\frac{1}{2}) \text{Vref}/16 < V_{cm}+V_d/2 < (X+\frac{3}{2})V_{ref}/16)$ and is inputted to SAR ADC, then the voltage boundary defines the range of search for SAR ADC.

If the resulting error of the flash ADC is less than (Vref/ 2^m)/8, the inbuilt redundancy of the above described SAR algorithm automatically takes care of the error, wherein m is a resolution of the flash ADC, and in such a scenario the above-described error correction technique is not applied to the SAR ADC.

Below are some of the advantages of using the flash ADC of the above described technique.

The error resulting from Vt shift of the comparator is resolved

Speed can increase, i.e., m−1 cycles in regular SAR algorithm can be skipped & (m−1)/2 cycles in novel SAR algorithm, wherein m is the resolution of the flash ADC The error due to DAC settling is significantly reduced as the change in top plate voltage is considerably less It can be seen that the above architecture of SAR ADC uses fewer DACs than what is used in the prior art architecture (i.e., by using N DACs), $N^2$ comparisons can be achieved and hence a significant reduction in area and power can be achieved. Further, the above technique can be used without requiring an adder/subtractor. Further, the above described process yields a higher speed and an improved performance, as much as two to four times over the prior art techniques. Furthermore, the inbuilt redundancy can overcome the errors induced due to Vt shift of comparator's MOSFETs which produces DNL patters, settling of DAC voltage which can give rise to DNL patters, settling of reference voltage which can produce DNL flaring and degrade signal to noise ratio (SNR), and noise on DAC reference and comparator which can increase DNL band and degrade SNR.

The above technique can yield solutions due to a specific equation and can be used in dynamic element matching of the capacitors. Further in these embodiments, only one resistive DAC can be used for providing all the required voltages, i.e., there is no need for 4 LSB CAP DACs, if a resistive string DAC is used on the LSB side. In the case of differential SAR ADCs, only one resistive DAC is used for both N and P CAP DACs in the one bit/trial SAR ADC.

In the above described technique one DAC can be larger than another DAC in the SAR ADC. This can facilitate in obtaining a higher speed as well as in shifting from 2 bits/trial to 1 bit/trial. Further, one can envision using two DACs of equal but half in size of full accuracy DAC for initial trials followed by connecting them to get full accuracy. Furthermore, this embodiment can result in reducing the silicon area. The error correction scheme explained with reference to FIG. 10 can be used between any two stages of the analog to digital converters (for example, the two stage flash ADC), two stage SAR ADC, and single stage SAR, such as redundant bit trail.

The above description is intended to be illustrative, and not restrictive. Many other embodiments will be apparent to those skilled in the art. The scope of the subject matter should therefore be determined by the appended claims, along with the full scope of equivalents to which such claims are entitled.

As shown herein, the present subject matter can be implemented in a number of different embodiments, including various methods and circuits. Other embodiments will be readily apparent to those of ordinary skill in the art. The elements, algorithms, and sequence of operations can all be varied to suit particular requirements. The operations described-above with respect to the methods illustrated in FIGS. 2, 3 and 7 can be performed in a different order from those shown and described herein.

FIGS. 1-10 are merely representational and are not drawn to scale. Certain proportions thereof may be exaggerated, while others may be minimized. FIGS. 1-10 illustrate various embodiments of the subject matter that can be understood and appropriately carried out by those of ordinary skill in the art.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive invention lies in less than all features of a single disclosed embodiment. Thus, the following claims are hereby incorporated into the detailed description of the embodiments of the invention, with each claim standing on its own as a separate preferred embodiment.

What is claimed is:

1. An analog to digital converter (ADC) comprising a plurality of conversion engines and a controller for controlling the operation of the analog to digital conversion engines, wherein the plurality of conversion engines comprise N DACs associated with M comparators, wherein M is substantially greater than N, wherein M and N are integers, and wherein the controller controls the operation of the plurality of conversion engines such that:

during a first phase of an analog to digital conversion process the plurality of conversion engines collaborate such that a plurality of bits can be determined during a single trial step;

during a second phase of the analog to digital conversion process the plurality of conversion engines work independently; and receiving outputs of at least one of the plurality of conversion engines by the controller and processes the received outputs to provide an output word.

2. The ADC of claim 1, wherein the N DACs are associated with less than or equal to $N^2$ comparators, wherein $N^2$ comparators is equal to number of conversion engines in the plurality of conversion engines.

3. The ADC of claim 1, wherein the plurality of conversion engines have at least 2 conversion engines.

4. The ADC of claim 3, further comprising a fourth conversion engine such that for an (X+1)th bit trial space examined by the ADC is greater than one-quarter of the trial space of the Xth bit trial, where X is an integer.

5. The ADC of claim 4, wherein the trial range of a current bit trial is offset.

6. The ADC of claim 5, wherein the offset corresponds to half of the size of a least significant bit being tested.

7. The ADC of claim 1, wherein the plurality of conversion engines comprise redundant bits for error correction.

8. The ADC of claim 1, wherein at least one of the conversion engines is responsive to an offset compensation circuit for introducing an offset to the conversion engine.

9. The ADC of claim 8, wherein the controller examines the output of each of the conversion engines while they are operating independently and is adapted to modify the offset compensation provided by the compensation circuit associated with a conversion engine to bring the output of the conversion engines into conformity.

10. The ADC of claim 9, where in the value of the offsets applied to the conversion engines is maintained at a preset value.

11. The ADC of claim 10, wherein the controller forms a sum of the offsets applied to the conversion engines and uses this to apply a correction to an output from the ADC.

12. The ADC of claim 1, wherein the analog to digital conversion is temporarily halted during the first phase, and an error correction step is performed in which all the conversion engines are set to the same threshold voltages and the capacitor arrays are temporarily connected together such that they have the same voltage on each array for the same digital word.

13. The ADC of claim 1, further comprising dither generator for introducing a known perturbation independently to the plurality of conversion engines either in the first phase or the second phase of the analog to digital conversion.

14. The ADC of claim 1, further comprising a least significant bit trial phase, in which the converters do not work in a collaborative manner.

15. The ADC of claim 1, further comprising a least significant bit trial phase is performed using a DAC selected from the group consisting of a resistive DAC and a capacitive DAC.

16. The ADC of claim 1, further comprising:
an error correction step during the digital conversion process in any of the phases.

17. An analog to digital converter (ADC) comprising a plurality of conversion engines and a controller for controlling the operation of the analog to digital conversion engines, wherein the plurality of conversion engines comprise X P CAP DACs and Y N CAP DACs associated with M comparators, wherein M is substantially greater than X and Y, wherein M, X and Y are integers, and wherein the controller controls the operation of the plurality of conversion engines such that:
during a first phase of an analog to digital conversion process the plurality of conversion engines collaborate such that a plurality of bits can be determined during a single trial step;
during a second phase of the analog to digital conversion process the plurality of conversion engines work independently; and
receiving outputs of a least one of the plurality of conversion engines by the controller and processes the received outputs to provide an output word.

18. An analog to digital converter (ADC) comprising a plurality of conversion engines, wherein the plurality of conversion engines comprise N DACs associated with M comparators, wherein M is substantially greater than N, wherein M and N are integers, wherein each analog to digital conversion engine has a sampling capacitor or a capacitor array on to which a value to be converted is sampled and wherein a controller array is provided for controlling the operation of the plurality of conversion engines such that:
during a first phase of the analog to digital conversion process, the plurality of conversion engines collaborate such that a plurality of bits are determined in single trial step; and
during a second phase of the analog to digital conversion process the sampling arrays or sampling capacitors of the conversion engines are connected together so as to form a composite converter for use in single bit trials.

19. The ADC of claim 18, wherein the N DACs are associated with less than or equal to $N^2$ comparators, wherein $N^2$ comparators is equal to number of conversion engines in the plurality of conversion engines.

20. The ADC of claim 18, wherein the plurality of conversion engines have at least 2 conversion engines.

21. The ADC of claim 18, wherein the plurality of conversion engines have at least three conversion engines.

22. The ADC of claim 21, wherein an (X+1)th bit trial following an Xth bit trial has a trial space greater than one quarter of the trial space of the Xth bit trial.

23. The method of converting an analog value into a digital equivalent using a plurality of conversion engines, wherein the plurality of conversion engines comprise N DACs associated with M comparators, wherein M is substantially greater than N, wherein M and N are integers, wherein each of the N CAP DACs has an associated P CAP DAC and an N CAP DAC, comprising:
sampling a signal to be converted into the plurality of conversion engines;
generating voltage differences between P CAP DACs and N CAP DACs such that they produce M threshold voltages;
operating the plurality of conversion engines in a first phase of the conversion by inputting the produced M threshold voltages to associated inputs of M comparators so that more than one bit can be determined from the sampled signal during each successive approximation trial;
operating the plurality of conversion engines in a second phase of the conversion by inputting the produced M threshold voltages into the associated inputs of the M comparators such that the plurality of conversion engines operate independently so that fewer bits are determined from the sampled signal during each successive approximation trial than were determined during the first phase; and
outputting a result obtained from at least one of the plurality of conversion engines.

24. The method of claim 23, outputting the result comprises:
obtaining results from the plurality of conversion engines; and
processing the obtained results to give a single output value.

25. The method of claim 24, outputting the result comprises:
obtaining the result from each conversion engine;
averaging obtained results; and
outputting the averaged result.

26. The method of claim 24, wherein the bits are selected from the group consisting of integers and fractions.

27. The method of claim 24, wherein operating the plurality of conversion engines in a first phase of the conversion by inputting the produced M threshold voltages to associated inputs of the M comparators so that more than one bit is determined per trial comprises:
operating the plurality of conversion engines in a first phase of the conversion by inputting the produced M threshold voltages to associated inputs of the M comparators so that 2 bits are determined per trial.

28. The method of claim 24, wherein operating the plurality of conversion engines in a second phase of the conversion by inputting the produced M threshold voltages into the associated inputs of the M comparators such that the plurality of conversion engines operate independently so that fewer bits are determined per trial comprises:

operating the plurality of conversion engines in a second phase of the conversion by inputting the produced M threshold voltages into the associated inputs of the M comparators such that the plurality of conversion engines operate independently so that one bit is determined per trial.

29. The method of claim 24, further comprising:
connecting top plates of substantially half of the P CAP DACs and that of N CAP DACs to VDD and top plates of substantially half of the P CAP DACs and that of N Cap DACs to GND during sampling of the signal;
generating a common mode voltage by shorting two halves of PDACs and two halves of NDACs substantially after sampling the signal; and
disconnecting the short between the two halves of PDACs and the two halves of NDACs substantially after generating the common mode voltage.

30. A method of converting an analog value into a digital equivalent using a plurality of conversion engines, wherein the plurality of conversion engines comprise X PCAP DACs and Y N CAP DACs associated with M comparators, wherein M is substantially greater than N, wherein M and N are integers, comprising:
sampling a signal to be converted into each P CAP DAC;
generating voltage differences between P CAP DACs and N CAP DACs such that they produce M threshold voltages;
operating the plurality of conversion engines in a first phase of the conversion by inputting the threshold voltage to an associated input of each comparator so that more than one bit can be determined from the sampled signal during each successive approximation trial;
operating the plurality of conversion engines in a second phase of the conversion by inputting the threshold voltage into the associated input of each of the plurality of comparators such that the plurality of conversion engines operate independently so that fewer bits are determined from the sampled signal during each successive approximation trial than were determined during the first phase; and
outputting a result obtained from at least one of the plurality of conversion engines.

31. The method of claim 30, outputting the result comprises:
obtaining results from the plurality of conversion engines; and
processing the obtained results to give a single output value.

32. The method of claim 30, wherein number of bits per trial is selected from the group consisting of integer and fraction.

33. A method of converting an analog value into a digital equivalent using a plurality of conversion engines, w wherein the plurality of conversion engines comprise N DACs associated with M comparators, wherein M is substantially greater than N, wherein M and N are integers, wherein each DAC has an associated P CAP DAC and an N CAP DAC, comprising:
sampling a signal to be converted into the plurality of conversion engines;
generating voltage differences between P CAP DACs and N CAP DACs such that they produce a threshold voltage;
operating the plurality of conversion engines in a first phase of the conversion by inputting the threshold voltage to an associated input of each comparator so that they cooperate to determined more than one bit from the sampled signal during at least one successive approximation trial; and
connecting sampling capacitor arrays of the plurality of conversion engines in parallel in a second phase of operation so as to form a combined conversion engine, and continuing the bit trials.

34. The method of claim 33, outputting the result comprises:
obtaining results from the plurality of conversion engines; and
processing the obtained results to give a single output value.

35. The method of claim 33, wherein number of bits per trial is selected from the group consisting of integer and fraction.

36. A method of performing an analog-to-digital conversion to obtain a digital representation of an input signal, comprising:
performing a first conversion of the input signal to obtain an estimate of at least the most significant portion of the digital representation, the first conversion being performed, at least in part, utilizing a fast ADC; and
performing a second conversion of the input signal, using the estimate of at least the most significant portion of the digital representation, on a SAR ADC, to determine the remaining bits of the digital representation, wherein the SAR ADC comprises:
a plurality of conversion engines; and
a controller for controlling the operation of the analog to digital conversion engines, wherein the plurality of conversion engines comprise N DACs associated with M comparators, wherein M is substantially greater than N, wherein M and N are integers, and wherein the controller controls the operation of the plurality of conversion engines such that:
during a first phase of an analog to digital conversion process the plurality of conversion engines work independently; and
receiving outputs of at least one of the plurality of conversion engines by the controller and processes the received outputs to provide an output word.

37. The method of claim 36, wherein the SAR ADC is implemented, at least in part, using switch capacitor techniques.

38. An ADC that produces an output digital representation of an input signal to be converted, comprising:
a fast ADC that performs a coarse conversion of the input signal to be converted and outputs the coarse conversion result; and
a SAR ADC including a plurality of conversion engines and a controller for controlling the operation of the analog to digital conversion engines, wherein the plurality of conversion engines comprise N DACs associated with M comparators, wherein M is substantially greater than N, wherein M and N are integers, and wherein the controller controls the operation of the plurality of conversion engines such that:
during a first phase of an analog to digital conversion process the plurality of conversion engines collaborate such that a plurality of bits can be determined during a single trial step using the coarse conversion result and the input signal;
during a second phase of the analog to digital conversion process the plurality of conversion engines work independently so that fewer bits are determined using the coarse conversion result and the input signal; and receiving outputs of at least one of the plurality of conversion engines by the controller and processes the received outputs to provide an output result.

39. The ADC of claim 38, wherein the N DACs are associated with less than or equal to $N^2$ comparators, wherein $N^2$ comparators is equal to number of conversion engines in the plurality of conversion engines.

40. The ADC of claim 38, wherein the plurality of conversion engines have at least 2 conversion engines.

41. The ADC of claim 38, wherein the controller obtains outputs from the plurality of conversion engines and processes the outputs to give a single output value.

* * * * *